United States Patent

Sato

Patent Number: 5,648,159
Date of Patent: Jul. 15, 1997

[54] DRY RESIST

[75] Inventor: Yoshinori Sato, Yamato, Japan

[73] Assignee: Diafoil Hoechst Company, Ltd., Tokyo, Japan

[21] Appl. No.: 489,579

[22] Filed: Jun. 12, 1995

[30] Foreign Application Priority Data

Jun. 14, 1994 [JP] Japan .................. 6-132000

[51] Int. Cl.$^6$ ................ B32B 5/16; B32B 27/06
[52] U.S. Cl. ............. 428/327; 428/323; 428/336; 428/480
[58] Field of Search ................... 428/327, 323, 428/336, 480

[56] References Cited

U.S. PATENT DOCUMENTS

| | | | |
|---|---|---|---|
| 2,299,839 | 10/1942 | McQueen | 18/48 |
| 2,579,415 | 12/1951 | Carson | 18/56 |
| 2,670,286 | 2/1954 | Minsk et al. | 95/7 |
| 2,750,863 | 8/1956 | Plambeck, Jr. | 95/5.6 |
| 3,526,504 | 9/1970 | Celeste | 96/35.1 |
| 3,940,939 | 3/1976 | Davis | 60/657 |
| 4,568,616 | 2/1986 | Seifried et al. | 428/480 |
| 4,590,119 | 5/1986 | Kawakami et al. | 428/323 |
| 4,687,700 | 8/1987 | Hensel et al. | 428/213 |
| 4,695,503 | 9/1987 | Liu et al. | 428/327 |
| 4,839,337 | 6/1989 | Imai et al. | 428/323 |
| 5,110,670 | 5/1992 | Janocha et al. | 428/327 |
| 5,277,970 | 1/1994 | Schuhmann et al. | 428/323 |
| 5,324,574 | 6/1994 | Sakamoto et al. | 428/327 |
| 5,372,879 | 12/1994 | Handa et al. | 428/327 |
| 5,374,467 | 12/1994 | Sato | 428/323 |
| 5,401,559 | 3/1995 | Okamoto et al. | 428/327 |
| 5,441,802 | 8/1995 | Mizuno et al. | 428/327 |

FOREIGN PATENT DOCUMENTS 2-083546  3/1990  Japan .

*Primary Examiner*—Patrick Ryan
*Assistant Examiner*—Cathy F. Lam
*Attorney, Agent, or Firm*—Foley & Lardner

[57] ABSTRACT

The disclosure describes a dry resist comprising:

a biaxially oriented laminated polyester film whose surface layer on at least one side contains particles having an average particle diameter of 0.01 to 3.0 μm, and has a center line average roughness of not less than 0.005 μm and a maximum height of less than 1.5 μm, and which has a haze of not more than 1.5%;

a photoresist layer formed on said biaxially oriented laminated polyester film; and a protective film formed on said photoresist layer.

13 Claims, No Drawings

DRY RESIST

BACKGROUND OF THE INVENTION

The present invention relates to a dry resist, and more particularly a high-quality dry resist capable of imparting high resolution and preventing occurrence of image fault.

Dry resist is popularly used in production of printed microcircuits. Dry resist is usually a laminated structure composed of a base film, a photoresist layer and a protective film. As a base film, a polyester film having excellent mechanical and optical properties, chemical resistance, heat resistance, dimensional stability, flatness and other features is mostly used. The photoresist layer is composed of a photosensitive resin, and the protective film is composed of a polyethylene or polyester.

The usage of the dry resist is briefly explained below.

First, the protective film is stripped off and the exposed photoresist layer is attached tightly on a conductive substrate bonded to a substrate. The conductive substrate is usually a copper plate. Then, a glass plate having microcircuits printed thereon is attached tightly to the base film side of the dry resist and light is irradiated thereto via the glass plate. As light passes through the transparent portion of the circuit image printed on the glass plate, the exposed portion alone of the photosensitive resin of the photoresist layer is reacted. Then, the glass plate and the base film are removed, and the unexposed portion of the photoresist layer is eliminated with an appropriate solvent. Etching is carried out with an acid or other suitable substance to remove the conductive substrate portion exposed by removal of the photoresist layer. This is followed by exposure to light and the reacted photoresist layer is eliminated by a suitable method. Consequently, the circuit of the conductive substance is formed on the substrate.

Recently, in the printed microcircuits, the circuits formed are very complicated, the lines are fine and close in interval, and accordingly high-level reproducibility of image formation and resolution are required. High quality is also required of the polyester film used as a base film.

It is essential that the polyester film used as a base film has a high transparency and a low haze. In the dry resist, when the photoresist layer is exposed to light, light passes through the base film as explained above. Therefore, if the base film is low in transparency, there arise the problems such as insufficient exposure of the photoresist layer and reduced resolution due to scatter of light.

On the other hand, the polyester film used as a base film is required to have an appropriate of slipperiness. Such slipperiness is necessary for bettering handling property of the polyester film when producing dry resist by forming photoresist layer on the said base film or handling property of the dry resist itself. Usually, this requirement is fulfilled by containing particles in polyester film so as to form fine protuberances on the film surface. Such protuberances are also closely adhere between the polyester film and circuit-printed glass substrate and eliminate the risk of impairing reproducibility of circuit image by reason that bubbles get in between the polyester film and the glass plate.

When protuberances are formed by particles contained in the film, however, transparency of the film is impaired. Thus, the development of a high-quality dry resist which can satisfy the property requirements for transparency, the slipperiness and an air leak property at the same time has been desired.

As a result of the present inventors' earnest studies, it has been found that when using as a base film a biaxially oriented laminated polyester film whose surface layer on at least one side contains particles having an average diameter of 0.01 to 3.0 μm, and has a center line average roughness (Ra) of not less than 0.005 μm and a maximum height (Rt) of less than 1.5 μm, and which has a haze of not more than 1.5%, the produced dry resist is of high-quality and capable of imparting a high resolution and preventing occurrence of image fault. The present invention has been attained on the basis of this finding.

SUMMARY OF THE INVENTION

The object of the present invention is to provide a high-quality dry resist capable of imparting a high resolution and preventing occurrence of image fault.

To accomplish the aim, in an aspect of the present invention, there is provided a dry resist comprising a biaxially oriented laminated polyester film of which an outermost surface layer on at least one side thereof contains particles having an average particle diameter of 0.01 to 3.0 μm and has a center line average roughness of not less than 0.005 μm and a maximum height of less than 1.5 μm, and which has a haze of not more than 1.5%; a photoresist layer formed on the surface opposite from the outermost surface layer of the said biaxially oriented laminated polyester film; and a protective film formed on the said photoresist layer.

DETAILED DESCRIPTION OF THE INVENTION

The biaxially oriented laminated polyester film used in the present invention is, for example, a polyester film produced by stretching and heat-treating an extruded film obtained by a co-extrusion method in which all of the layers are melt extruded simultaneously from the extruder die. The following description of the present invention is based on the case where a coextruded, two-layered film is used as a laminated film, however the present invention is, of course, not limited to use of such coextruded, two-layered film but can be similarly embodied by using a three or more layered film within the claimed scope of the present invention.

Polyester for forming each layer of the biaxially oriented laminated polyester film used in the present invention is a resin obtained by using an aromatic dicarboxylic acid or an ester thereof and a glycol as main starting materials, specifically a resin in which not less than 80% of the recurring structural units are ethylene terephthalate or ethylene-2,6-naphthalate units. Such polyester may contain a third component as far as the above-specified range are satisfied.

Aromatic dicarboxylic acids usable as starting material of the polyester used in the present invention include terephthalic acid, 2,6-naphthalenedicarboxylic acid, isophthalic acid, phthalic acid, adipic acid, sebacic acid, 4,4'-diphenyldicarboxylic acid and oxycarboxylic acids (such as p-oxyethoxybenzoic acid). Glycols usable as another starting material of the polyester used in the present invention include ethylene glycol, diethylene glycol, triethylene glycol, propylene glycol, butanediol, 1,4-cyclohexanedimethanol, neopentyl glycol and the like. These glycols may be used either singly or as a mixture thereof.

In the biaxially oriented laminated polyester film (hereinafter referred to as "laminated film") used in the present invention, the surface layer on at least one side thereof contains particles (this surface layer is hereinafter referred to as "layer A"). The layer A is formed on at least one side of the laminated film. In the present invention, since the laminated film needs to have high-degree transparency, it is preferable that the layer A which is designed so as to impart an appropriate slipperiness to the laminated film is provided on one side alone of the film. It is also preferable that the layers (films) other than the layer A of the laminated film are substantially free of particles or contain only a small amount (i.e., not more than 0.2 wt %) of particles. However, in order to prevent occurrence of scratches to the film side opposite from the layer A or to improve winding characteristics of the laminated film, a small amount of particles may be contained in the layer B of a two-layered (A/B) film or in layer C of a three-layered (A/B/C) film. Also, in a film of a three-layered (A/B/A') structure, the layer A' composed of the same polyester composition as the layer A but smaller than the layer A in thickness may be provided on the side opposite from the layer A so as to form a smaller number of protuberances on the surface of the layer A' than on the surface of the layer A.

Thickness of the layer A in the laminated film according to the present invention is usually 0.005 to 3 µm, preferably 0.05 to 1 µm, more preferably 0.1 to 0.5 µm. When thickness of the layer A exceeds 3 µm, it may become unable to provide desired high-degree transparency to the laminated film. On the other hand, when the thickness is less than 0.005 µm, the particles contained in the layer A tend to come off the layer, resulting in reduced wear resistance of the laminated film. If the fallen particles or wear dust are produced and get in between the laminated film and the photoresist layer, they may adversely affect reactivity of the photosensitive resin, giving rise to serious problems such as reduced reproducibility of image formation.

The particles usable in the present invention include inorganic particles such as particles of calcium carbonate, calcium phosphate, silica, kaolin, talc, titanium dioxide, alumina, barium sulfate, calcium fluoride, lithium fluoride, zeolite, molybdenum sulfide, etc.; crosslinked polymer particles; organic particles such as particles of calcium oxalate; and precipitated particles produced in the course of polyester polymerization. The "precipitated particles" in the present invention refer to particles which are precipitated in the reaction system when a system using an alkali metal or alkaline earth metal compound as ester exchange catalyst is polymerized in the usual way. They also include particles precipitated by adding terephthalic acids during ester exchange reaction or polycondensation reaction. In these cases, one or more of phosphoric or phosphorous acid and phosphorus compounds such as trimethyl phosphate, triethylphosphate, tributyl phosphate, ethyl acid phosphate, trimethyl phosphite, triethyl phosphite, tributyl phosphite, etc. may be allowed to exist in the reaction system. In the case where the esterification step is involved, particles of inactive material can be precipitated in the same manner. For instance, polycondensation reaction may be carried out in the presence or absence of a phosphorus compound by allowing an alkali metal or alkaline earth metal compound to exist in the reaction system before or after completion of the esterification reaction.

Among the particles mentioned above, the crosslinked polymer particles and silica particles are preferably used for obtaining high-degree transparency and desired slipperiness of the laminated film. These particles are capable of improving slipperiness of the film without elevating its haze as they have advantageous properties in terms of affinity with polyester and refractive index.

The particles contained in the surface layer may be of one kind, or two or more kinds of particles may be used in admixture. It is also possible to use the particles of the same kind but with the different particle diameter. In the case where the crosslinked polymer particles or silica particles are contained together with other kind(s) of particles, it is preferable that the content of crosslinked polymer particles or silica particles is higher than that of other kind(s) of particles.

An average particle diameter of these particles is in the range of 0.01 to 3.0 µm, preferably 0.1 to 3.0 µm. In case of using crosslinked polymer particles, the average particle diameter is preferably 0.1 to 2.0 µm. When the average particle diameter exceeds 3.0 µm, the protuberances formed on the laminated film surface become greater than those required, thereby making adhesion with the circuit-printed glass substrate surface imperfect. Also, particles tend to come off the film to cause deterioration of wear resistance. When the average particle diameter of the said particles is less than 0.01 µm, there arise the problems such as unsatisfactory slipperiness of the laminated film because of insufficient formation of protuberances and entrance of bubbles in the spaces between the laminated film and the glass substrate when attached to each other.

It is preferable that particle size distribution of the particles used in the present invention is of a small range. In the laminated film used in the present invention, particles exist mostly in or near the surface layer, so that the presence of coarse particles causes formation of large protuberances. If the large protuberances are present on the film surface, its adhesion with the glass substrate becomes imperfect, resulting in reduced resolution. Therefore, it is preferable not to allow presence of coarse particles which cause formation of large protuberances, and for this reason, the use of particles with a narrow particle size distribution can be recommended. Specifically, it is preferable that the particle size distribution is not more than 2.0, more preferably not more than 1.8. The particle size distribution shown here is represented by the following equation:

$$\text{Particle size distribution index} = d_{25}/d_{75}$$

(wherein $d_{25}$ and $d_{75}$ represent the particle diameters (µm) of the particles corresponding to 25% and 75%, respectively, of the total accumulated volume when the volumes of the particle groups were integrated from the larger particles).

When the said particle size distribution exceeds 2.0, the resolution of the dry resist tends to lower. The particles having an average diameter exceeding 0.3 µm are especially preferred for satisfying the above requirement for particle size distribution.

Typical examples of the particles with a narrow particle size distribution are spherical crosslinked polymer particles and spherical silica particles such as disclosed in Japanese Patent Application Laid-Open (Kokai) No. 59-217755.

It is especially recommended to use spherical crosslinked polymer particles for their advantages in providing higher resolution and inhibiting entrance of bubbles between the dry resist and the glass substrate, or preventing particles from coming off the film. The spherical crosslinked polymer particles have little risk of coming off the polyester film because of good affinity with polyesters, and contain no coarse particles, so that they can satisfy high-level property required at the same time.

A crosslinked polymer suited for use in the present invention can be obtained by copolymerizing at least one of monovinyl compounds (a) having only one aliphatic unsaturated bond in the molecule and at least one of compounds (b) having two or more aliphatic unsaturated bonds in the molecule, which serves as crosslinking agent, in the presence of a specific initiator by means of emulsion polymerization. The "emulsion polymerization" referred to herein means emulsion polymerization in a broad sense, which includes seed emulsion polymerization. Examples of the compounds (a) are acrylic acid, methacrylic acid, alkyl or glycidyl esters thereof, maleic anhydride and its alkyl derivatives, vinyl glycidyl ether, vinyl acetate, styrenes and alkyl-substituted styrenes. Examples of the compounds (b) are divinylbenzene, divinylsulfone, ethylene glycol dimethacrylate and 1,4-butanediol diacrylate. At least one of the compounds (a) and at least one of the compounds (b) are used in the present invention. A compound containing nitrogen atoms or ethylene may be copolymerized. As polymerization initiator, there can be used water-soluble polymerization initiators including, but not limited to potassium persulfate, potassium persulfate-sodiumthiosulfate, hydrogen peroxide.

Since agglomerates of particles may be formed depending on the combination of the said compounds or the particle-synthesizing conditions, it is recommended to use a dispersion stabilizer such as mentioned below for maintaining dispersibility of the particles. As dispersion stabilizer, there can be used anionic surfactants such as fatty acid salts, alkylsulfuric acid esters, alkylbenzenesulfonates, alkylsulfosuccinates, alkylnaphthalenesulfonates, alkyldiphenyl ether disulfonates, alkylphosphates and polyoxyethylenealkyl or alkylarylsulfuric acid esters, nonionic surfactants such as polyoxyethylenealkylether, polyoxyethylenealkylaryl ether, polyoxyethylene derivatives, polyoxyethylene-oxypropylene block copolymer, sorbitan fatty acid esters, polyoxyethylene sorbitan fatty acid esters, polyoxyethylene sorbitol fatty acid esters and glycerin fatty acid esters, cationic surfactants such as alkylamine salts and quaternary ammonium salts, and amphoteric surfactants such as alkylbetaine and amine oxide. Anionic surfactants such as alkyldiphenyl ether disulfonates are especially suited for use in the present invention.

The crosslinked polymer used in the present invention is preferably heat-resistant resin whose loss in weight after 2-hour heating at 300° C. in nitrogen gas is not more than 20% by weight, more preferably not more than 10% by weight. When the loss in weight exceeds 20% by weight, the particles tend to fuse together to form agglomerates of particles. A process for producing crosslinked polymer particles usable in the present invention is described below.

Predetermined amounts of a water-soluble polymerization initiator such as potassium persulfate and a dispersion stabilizer such as alkyldiphenyl ether disulfonate are dissolved in an aqueous solvent, and then a mixed solution of predetermined amounts of compound (a) and compound (b) is added thereto. Reaction is carried out with stirring at a temperature above the decomposition starting temperature of the polymerization initiator, preferably at 30° to 90° C. for about 3 to 10 hours. In this case, particles are obtained as a uniformly dispersed water slurry. Any available particle production process can be employed as far as the purpose of the present invention can be fulfilled.

The content of particles in the layer A is 0.1 to 20.0% by weight, preferably 0.1 to 5.0% by weight, more preferably 0.2 to 2.0% by weight. When the particle content is less than 0.1% by weight, the number of the protuberances formed on the layer A surface tends to prove insufficient, giving rise to problems such as unsatisfactory slipperiness of the laminated film, entrance of bubbles between the laminated film and the glass substrate, and higher risk of inflicting damage to film surface during film production, resulting in reduced transparency of the laminated film. On the other hand, when the particle content in the layer A exceeds 20.0% by weight, particles tend to come off the film or agglomerate with each other to form coarse protuberances.

It is preferable that the content of particles in the layers other than the layer A is lower than the particle content in the layer A, the preferred content being not more than 0.2% by weight, more preferably not more than 0.1% by weight based on the polyester in the whole laminated film. When the particle content in the layers other than the layer A exceeds 0.2% by weight based on the polyester in the whole laminated film, transparency of the laminated film lowers.

Haze of the laminated film used in the present invention is not more than 1.5%, preferably not more than 1.2%, more preferably not more than 1.0%. When haze of the laminated film is higher than 1.5%, desired resolution is not provided.

In production of particles-blended polyester which constitutes the laminated film used in the present invention, particles may be added in the course of synthesis reaction of polyester, or may be directly added to polyester. In case of adding particles in the course of synthesis reaction, it is recommended to form a slurry of particles by dispersing them in ethylene glycol or the like and add such slurry at a pertinent stage in the polyester synthesis process. In the case where the particles are added directly to polyester, preferably particles are dried or a slurry is formed by dispersing particles in water or an organic solvent having a boiling point of not more than 200° C., and the dry particles or the said slurry is added to polyester by using a vented twin-screw extruder. The particles to be added may be subjected to pertinent treatment such as comminution, dispersion, classification, filtering, etc., before added to polyester.

For adjusting particle content, a method is effective in which a master batch containing particles in a high concentration is prepared in the manner described above, and when the film is formed, the said master batch is diluted with the material containing substantially no particles to adjust particle content.

A center line average roughness (Ra) of the layer A surface of the biaxially oriented laminated polyester film used in the present invention is not less than 0.005 μm, preferably not less than 0.008 μm, more preferably 0.01 to 0.1 μm. When Ra is less than 0.005 μm, the handling property and winding characteristics of the laminated film are unsatisfactory. On the other hand, when Ra exceeds 0.1 μm, the resolution of the dry resist may be lowered.

The maximum height (RE) of the layer A surface is less than 1.5 μm, preferably not more than 1.0 μm. When Rt is greater than 1.5 μm, the resolution of the dry resist is reduced due to improper adhesion with glass substrate.

In the present invention, in order to satisfy both requirements of slipperiness and transparency at a very high level, the layer A can be composed of a polyester having a lower melting point than the polyester constituting other layers. In this case, the polyester used for the layer A is preferably a copolymerized polyester containing not less than 50% of the polyester constituting the adjoining layer for preventing separation of the layer A and its adjoining layer.

When the low-melting polyester is used for the layer A, the ratio (d/t) of the average diameter [d (μm)] of the particles contained in the layer A to the thickness [t (μm)] of the layer A is preferably 0.5 to 10, more preferably 0.5 to 8, even more preferably 0.8 to 5. When d/t is less than 0.5, the protuberances formed on the laminated film surface tend to prove insufficient to impart desired slipperiness to the film. When d/t is greater than 10, the particles tend to come off the film.

Also, when the layer A is made of the low-melting polyester, the heat-treatment after biaxial stretching in the laminated film forming process is preferably carried out at a temperature not less than (T−10)° C. (T: the melting point of the layer A polyester) for providing desired slipperiness and transparency to the laminated film. Such high-temperature heat-treatment is helpful for enhancing transparency of the laminated film by greatly discouraging orientation of the layer A or eliminating voids present around the particles by melting polyester of the layer A. Also, this treatment sharpens the shape of protuberances to remarkably improve slipperiness of the laminated film.

Intrinsic viscosity of the polyester of the biaxially oriented laminated polyester film used in the present invention is preferably in the range of 0.45 to 1.0, more preferably 0.50 to 0.80. When the intrinsic viscosity of the said polyester exceeds 1.0, load in the process of polyester preparation and during melt extrusion of polymer elevates due to high viscosity, and may cause a reduction of production efficiency. On the other hand, when the said intrinsic viscosity is less than 0.45, troubles such as break of film in its production process tend to occur.

The photoresist layer on the laminated film of the present invention can be formed by using known photoresist compositions, for example, negative photoresist compositions disclosed in Japanese Patent Publication (Kokoku) No. 45-25231 and Japanese Patent Application Laid-Open (Kokai)No. 2-83546.

For example, crosslinkable compositions or photopolymer compositions are used as photoresist composition for the dry resist according to the present invention. As suitable crosslinkable compositions, photopolymerizable compositions, photo-dimerizable materials such as cinnamic esters of high-molecular weight polyols, chalcone and polymers having benzophenone-type groups, and materials such as polyvinyl cinnamate and polyvinyl anisylacetophenone which are described in Chapter 4 of J. Kosar: Light-Sensitive Systems, published by John Willy & Sons Inc., New York. These compounds are capable of direct crosslinking under the influence of activative light (and in the presence or absence of a sensitizer) or capable of forming crosslinkage through a separate photosenitives. Examples of the latter type of compounds are polyacrylic or polymethacrylic acid amides, derivatives thereof, polymeric polyols, and combined materials of natural colloids, for example, high polymeric substances such as gelatin, glue or shellac, with photosensitive crosslinking agents such as dichromate metal salts, diazo compounds and azides. Other suitable materials are combined materials of polyvinyl alcohol with borax and ammonium dichromate; combined materials of polyvinyl pyrrolidone with ammonium dichromate and monoammonium phosphate such as described in Chapter 2 of the above-mentioned Kosar's book; combined materials of styrene-butadiene copolymer with 2,6-di-(4'-azidobenzal)-4-methylcyclohexane and di-n-butylphthalate (used as plasticizer); combined materials of vinyl acetate-vinyl-3-azidophthalate polymer with 1-methyl-2-benzoylmethylene-β-naphthothiazoline and triethylene glycol diacetate (as plasticizer) such as described in Chapter 7 of the above-mentioned Kosar's book; combined materials of polyamide resins such as disclosed in U.S. Pat. Nos. 2,579,415 and 2,299,839, polyvinyl alcohol such as disclosed in U.S. Pat. No. 2,670,286 and cinnamic esters of cellulose with quinone compounds; and materials commercially available from Dynachem Corp. under the trade name of Dynachem Photo Resist. When using these materials, there is no need of adding a polymeric binder. It is of course possible, however, to use a binder such as disclosed in U.S. Pat. No. 2,760,863 as desired.

Some typical examples of photoresist compositions usable in the present invention are shown below.

(1)
Poly(methyl methacrylate/acrylonitrile/acrylated glycidyl acrylate)(65/10/25)
Poly[methyl methacrylate/acrylic acid (β-hydroxyethyl)] (90/10)
Triethylene glycol diacetate
Tertiary butylanthraquinone
2,2'-methylene-bis-(4-ethyl-6-tert-butylphenol)
Ethyl violet
Methyl ethyl ketone (2)
Poly(methyl methacrylate/butyl methacrylate/acrylated glycidyl methacrylate)(1/1/1)
Triethylene glycol diacetate
Tertiary butylanthraquinone
Trichloroethylene (3)
Poly(methyl methacrylate/itaconic acid)(19/1)
Pentaerythritol triacrylate (refer to Belgian Patent No. 646,889, Example 1)
Tertiary butylanthraquinone
Crystal violet
Methyl ethyl ketone (4)
Poly(methyl methacrylate/methacrylic acid) (9/1)
Pentaerythritol triacrylate
Ethyl violet
9,10-phenanthrenquinone
Acetone (5)
Poly(methyl methacrylate/acrylonitrile/acrylated glycidyl acrylate)(65/10/25)
Tertiary butylanthraquinone
Ethyl violet
Methyl ethyl ketone (6)
Binder solution*
Pentaerythritol acrylate
Ethyl violet
Tertiary butylanthraquinone
Acetone

*: 24.7% solution of poly(methyl methacrylate/methacrylic acid, 90/10) in methyl ethyl ketone (7)
Polyvinyl cinnamate
2-tert-butylanthraquinone
Methyl ethyl ketone (8)
Methyl methacrylate/acrylonitrile/acrylated glycidyl acrylate (90/5/5 in molar ratio) copolymer
Methyl methacrylate/2-hydroxyethylacrylate (90/10 in molar ration) copolymer
Triethylene glycol acetate
Tert-butylanthraquinone
2,2'-methylene-bis(4-ethyl-6-tert-butylphenol)
Ethyl violet
Methyl ethyl ketone As the protective film in the present invention, known films can be used. For instance, polyester film, polyethylene film, polypropylene film, polystyrene film, polyvinyl alcohol film and the like can be used. Thickness of the protective film is 5 to 100 μm, preferably 15 to 50 μm.

A process for producing a biaxially oriented laminated polyester film used in the present invention is of a coextrusion method which is best suited for producing the said laminated film.

Polyester feedstocks which constitute the respective layers are supplied to a laminating extrusion machine comprising two or more extruders and three or more layered multimanifold or feed block. The said polyester materials are laminated and extruded into a three or more layered molten sheet from a slit die. Thickness of the respective layers can be set as desired by adjusting the polymer throughput by a constant-charging feeder such as gear pump provided in the melt line. The molten sheet extruded from the die is quickly cooled to a temperature below glass transition temperature on a rotary cooling drum and thereby solidified to obtain a non-oriented sheet of a substantially amorphous state. In this case, in order to improve flatness of the sheet, it is necessary to enhance adhesion between the sheet and the rotary cooling drum, and for this purpose, an electrostatic pinning method and/or a liquid application pinning method are favorably used in the present invention.

In the present invention, the sheet obtained in the manner described above is stretched biaxially to form an oriented film. The sheet is initially stretched 3.0 to 7 times, preferably 3.2 to 6 times in one direction at a temperature in the range of 70° to 150° C., preferably 75° to 130° C., by a roll- or tenter-type stretching machine. Then the sheet is further stretched 3.2 to 7 times, preferably 3.5 to 6 times in the direction orthogonal to the initial stretch at a temperature in the range of 75° to 150° C., preferably 80° to 140° C., to obtain a biaxially oriented film. Stretching in one direction may be performed in two or more stages, but in this case, too, it is preferable that the final stretching ratio falls in the above-defined range. Also, the said non-stretched sheet may be biaxially stretched simultaneously 10 to 40 times in surface area.

The thus obtained film is heat-treated at 150° to 250° C. for a period from one second to 5 minutes with its elongation limited within 30%, under restricted shrinkage or fixed length. After the said biaxial stretching, the film may be re-stretched 1.05 to 2.5 times in the machine (longitudinal) direction at 110° to 180° C., followed by heat-treatment. For the above heat-treatments, it is possible to employ suitable techniques such as heat-setting before re-stretching in the machine direction, longitudinal relaxing after re-stretching, or stretching in the machine direction by a small ratio before or after re-stretching. Similar re-stretching may be performed in the transverse direction. Further, various surface treatments may be applied in the film forming process.

The laminated polyester film used in the present invention may have a coating layer on the layer A side the opposite side thereof or on both sides of the laminated film for the purpose of adjusting adhesion to the photoresist layer. Such coating layer may be provided in the film forming process or after formation of the laminated film. In view of uniformity of coating thickness and production efficiency, the said coating is preferably carried out after stretching in the machine direction and before transverse stretching in the film forming process.

As a coating material, various kinds of resins such as polyesters, polyamides, polystyrenes, polyacrylates, polycarbonates, polyarylates, polyvinyl chloride, polyvinylidene chloride, polyvinyl butyral, polyvinyl alcohol, polyurethanes, etc., copolymers of these resins and mixtures thereof can be used.

In the present invention, other polymers (such as polyethylenes, polystyrenes, polycarbonates, polysulfones, polyphenylene sulfide, polyamides, polyimides, etc.) may be contained in an amount not exceeding 1% by weight based on the total amount of polyesters subjected to film forming. It is also possible to blend suitable additives such as antioxidant, heat stabilizer, antistatic agent, lubricant, dye, pigment, etc., as desired.

On the surface opposite from the layer A of the biaxially oriented laminated polyester film are formed a photoresist layer and a protective film by a known method. That is, a photoresist composition is coated on the surface of the biaxially oriented laminated polyester film used as base film, and then a protective film is laminated thereon.

Coating of the laminated film with a photoresist composition can be accomplished by various methods using suitable coating devices such as reverse coater, gravure coater, rod coater, air doctor coater, etc., described in Y. Tasaki: Coating System, Maki Shoten, 1979, or by other methods such as extrusion laminating, melt coating, etc. If necessary, the coating film may be subjected to drying. Such drying should be conducted within limits not exerting any adverse effect to the properties of polyester film. It is also advisable to apply a known discharge treatment such as corona discharge on the film surface before coating with a photoresist composition for improving adhesiveness or uniformity of the coating.

On the thus formed photoresist layer is laminated a protective film by a suitable method such as pressure laminating. It is here imperative that the adhesion between protective film and photoresist layer is less than the adhesion between the base film and the photoresist layer.

The dry resist according to the present invention is a high-quality photoresist capable of providing a high resolution and preventing occurrence of image fault and thus has a very high industrial value.

EXAMPLES

The present invention is explained in more detail in the following Examples, however, it should be recognized that the scope of the present invention is not restricted to these Examples.

The determination methods and definitions of the properties and performance shown in the Examples are as described below. In the following Examples and Comparative Examples, all "parts" are "part by weight", unless otherwise noted.

(1) Average particle diameter and particle size distribution

In the case of the particles uniform in size and shape such as spherical crosslinked polymer particles, an average particle diameter was determined by electron microscope. That is, diameters of approximately 1,000 particles were measured with the volumes of the particles integrated from the larger particles. A particle diameter at the point of 25% of a cumulative volume based on the total cumulative volume was represented by $d_{25}$, particle diameter at the point of 50% of a cumulative volume based on the total cumulative volume was represented by $d_{50}$, and a particle diameter at the point of 75% of a cumulative volume based on the total cumulative volume was represented by $d_{75}$. The value of $d_{50}$ was indicated as an average particle diameter and the ratio ($d_{25}/d_{75}$) of $d_{25}$ to $d_{75}$ was indicated as particle size distribution.

Regarding other shaped particles, particle diameter at the point of 50% of a cumulative volume based on the total cumulative volume on the equivalent sphericity distribution curve as measured by a centrifugal sedimentation-type particle size distribution meter (SA-CP 3, manufactured by Shimadzu Corp.) was indicated as average particle diameter $d_{50}$, and the ratio ($d_{25}/d_{75}$) of the particle diameter at the point of 25% of a cumulative weight based on the total cumulative weight (particle weights being integrated from the larger particles) to the diameter at the point of 75% of a cumulative weight based on the total cumulative weight was indicated as particle size distribution.

(2) Intrinsic viscosity [η] of polymer (unit: dl/g)

One gram of polymer was dissolved in 100 ml of a 50/50(by weight) phenol/tetrachloroethane mixed solvent and the viscosity of the solution was measured at 30° C.

(3) Surface layer thickness

Determined by observation of the film section under a transmission electron micrograph (TEM). A small piece of the laminated film was embedded in an epoxy resin blended with accruing agent and an accelerating agent, and sliced into an approximately 200 nm-thick piece by an ultramicrotome to prepare a sample for observation. A section of this sample film was microphotographed using a transmission electron microscope H-9000 (manufactured by Hitachi Corp.) to measure its surface layer thickness. The accelerating voltage applied was 300 kV and the magnification was set in the range of ×10,000 to ×100,000 depending on the surface layer thickness. Thickness measurement was made at 50 points. The largest 10 measurements and the smallest 10 measurements were eliminated, and the average of the remaining 30 measurements was shown as the measured value of surface layer thickness.

(4) Center line average roughness (Ra)

Determined in the following way using a surface roughness tester SE-3F (manufactured by Kosaka Kenkyusho Ltd). A film portion with a reference length L (2.5 mm) was cut out in the direction of the center line from a sectional curve of the film. Plotting the center line of the cut out portion as X axis and the direction of longitudinal magnification as Y axis, with roughness curve represented by: y=f(x), the value (μm) given from the following equation was determined as average roughness. Actually, 10 sectional curves were chosen from the sample film surface and the mean value of center line average roughness of the cut out portion as determined from the said 10 sectional curves was calculated. Measurement was made under the following conditions, in which tip radius of stylus=2 μm; load=30 mg; and cut-off=0.08 mm.

$$Ra = 1/L \int_0^L |f(x)| dx$$

(5) Maximum height (Rt)

The cut out portion with a sectional curve used for determination of Ra was held by two straight lines parallel to the average line of the said portion, and the interval of the said two straight lines was measured in the direction of longitudinal magnification of the sectional curve. 10 sectional curves were chosen from the sample film surface and the mean value of maximum height of the cut out portion determined from the said sectional curves was indicated as maximum height [Rt (μm)].

(6) Film haze

Cloudiness of the laminated film was determined according to JIS-K-7105 using a hazemeter NDH-20D manufactured by Nippon Denshoku Kogyo Co., Ltd.

(7) Practical performance of dry resist

Using the dry resist obtained in Example 7, a printed circuit board was made. The photoresist layer side of the dry resist from which the protective film has been stripped off was attached closely to a copper plate provided on a glass fiber-reinforced epoxy resin plate. Then a circuit-printed glass substrate was attached on the resist and ultraviolet light was applied thereto via the glass substrate. Then the resist film was separated and subjected to development operations (washing, etching, etc.) to form circuits.

The thus obtained circuits were observed visually or through a microscope, and the practical performance of the resist was evaluated concerning the following items under the criteria described below.

Resolution

Rank 1: Very high resolution and capable of forming clear circuits.

Rank 2: Rather low in clearness and inadequate phenomena such as thickening of lines, but no problem in practical use.

Rank 3: Poor in clearness and unfit for forming high-density circuits. Incapable of practical use.

Fault of Circuit

Rank 1: No circuit fault.

Rank 2: Circuit fault only rarely.

Rank 3: Circuit fault and incapable of practical use.

Handling Property

Handling property during manufacture and in use of the dry resist were evaluated.

Rank 1: Appropriate slipperiness and good handling property.

Rank 2: Rather insufficient in slipperiness, therefore somewhat inferior in handling property, but no problem in practical use.

Rank 3: Insufficient in slipperiness and bad in handling property such as stoppage of running film during manufacture and in use of the resist. Incapable of practical use.

EXAMPLE 1

Production of Spherical Crosslinked Polymer Particles 1.5 parts of potassium persulfate used as water-soluble polymerization initiator, and 0.5 parts of sodium lauryl sulfate (Emal 0, produced by Kao Corp.) of an anionic surfactant used as dispersion stabilizer, were added to 800 parts of water and uniformed dissolved. Then a mixed solution of 40 parts of styrene, 30 parts of methyl methacrylate and 30 parts of divinylbenzene was added, and polymerization reaction was carried out with stirring in a nitrogen gas atmosphere at 70° C. for 15 hours. Reaction degree was 98%. Average particle diameter of the produced particles was 1.0 μm and particle size distribution was 1.05. The obtained particles were substantially spherical.

Then the aqueous slurry of the produced particles was cooled to 50° C., and to this slurry was added one part of a partial ammonium neutralizate of sodium polyacrylate/methoxypolyethylene glycol/polypropylene glycol monomethacrylate copolymer. The obtained mixture was stirred for one hour, then 2,000 parts of ethylene glycol was added and water was evaporated away by heating under reduced pressure.

Production of Pulverized Crosslinked Polymer Particles

A homogeneous solution of 100 parts of methyl methacrylate, 35 parts of divinylbenzene, 32 parts of ethylvinylbenzene, 1 part of benzoyl peroxide, 100 parts of toluene and 30 parts of polystyrene having an average molecular weight (Mn) of 20,000 was dispersed in 700 parts of water.

The obtained dispersion was heated and polymerized with stirring in a nitrogen atmosphere at 70° C. for 15 hours.

The produced granular crosslinked polymer had an average particle diameter of about 0.2 mm. This polymer was washed with water and extracted with 500 parts of toluene at room temperature to remove small amount of unreacted monomers, linear monomers and polystyrene. Then, the polymer was washed with 200 parts of methanol and 500 parts of water and dried in vacuo at 80° C. for 24 hours.

The granular product was crashed by a jet mill and further pulverized by a sand grinder. The thus obtained pulverized crosslinked polymer particles had an average particle diameter of 0.4 μm and a particle size distribution of 1.8.

Preparation of Polyester 80 parts of dimethyl terephthalate, 20 parts of dimethyl isophthalate, 60 parts of ethylene glycol and 0.09 parts of magnesium acetate tetrahydrate were supplied into a reactor, and the mixture was heated while evaporating away methanol to carry out ester exchange reaction. Temperature was raised to 230° C. in 4 hours after start of the reaction, and at this point the ester exchange reaction was substantially completed.

Then, an ethylene glycol slurry of the previously produced spherical crosslinked polymer particles was added thereto. Thereafter, 0.03 parts of phosphoric acid and 0.04 parts of antimony trioxide were further added and the reaction system was gradually reduced in pressure and heated to carry out polycondensation reaction for 4 hours, thereby obtaining copolymerized polyethylene terephthalate (A) having an intrinsic viscosity of 0.650. The content of spherical crosslinked polymer particles was 1.0% by weight.

The same procedures of ester exchange reaction and polycondensation reaction as the production of copolymerized polyethylene terephthalate (A), were conducted except that 2.0 parts of spherical silica particles having an average particle diameter of 1.2 μm and a particle size distribution of 1.1 were added thereto in the form of an ethylene glycol slurry instead of the said spherical crosslinked polymer particles, thereby obtaining a copolymerized polyethylene terephthalate (B) having an intrinsic viscosity of 0.645.

The same procedures of ester exchange reaction and polycondensation reaction as the production of copolymerized polyethylene terephthalate (A), were carried out except that no spherical crosslinked polymer particles were added, and that 100 parts of terephthalic acid was used instead of dicarboxlic acid as starting material, obtaining a polyethylene terephthalate (C) having an intrinsic viscosity of 0.630 and containing substantially no inactive particles.

The same procedures of ester exchange reaction and polycondensation reaction as the production of copolymerized polyethylene terephthalate (C), were carried out except for adding 0.6 parts of synthetic calcium carbonate having an average diameter of 0.65 μm and a particle size distribution index of 1.50 in the form of ethylene glycol slurry, thereby obtaining a polyethylene terephthalate (D) having an intrinsic viscosity of 0.625.

The same procedures of ester exchange reaction and polycondensation reaction as the production of copolymerized polyethylene terephthalate (D), were conducted except that the previously produced pulverized crosslinked polymer particles were added instead of synthetic calcium carbonate, thereby obtaining a polyethylene terephthalate (E) having an intrinsic viscosity of 0.625. The content of pulverized crosslinked polymer particles was 0.1% by weight.

The same procedures of ester exchange reaction and polycondensation reaction as the production of copolymerized polyethylene terephthalate (D), were conducted except that the previously produced spherical crosslinked polymer particles were added instead of synthetic calcium carbonate, thereby obtaining a polyethylene terephthalate (F) having an intrinsic viscosity of 0.615. The content of spherical crosslinked polymer particles was 1.0% by weight.

By microscope observation of the inside of polyethylene terephthalates (A), (B), (C), (D), (E) and (F), uniform dispersion of the particles was confirmed.

Production of Polyester Film

Copolymerized polyethylene terephthalate (A) as material for the layer A and polyethylene terephthalate (C) as material for the layer B were melt-extruded from the separate melt extruders to obtain a two-layer (A/B) laminated amorphous sheet. A vented twin-screw extrude was used for melt extrusion of the layer A material.

This amorphous sheet was stretched 3.6 times in the machine direction (longitudinal direction) at 93° C., further stretched 4.2 times in the transverse direction at 110° C. and heat-treated at 230° C. for 6 seconds to obtain a biaxially oriented laminated film. The total thickness of the obtained film was 22 μm, with the layer A thickness being 0.6 μm.

EXAMPLE 2

The same procedure as Example 1 was carried out except that copolymerized polyethylene terephthalate (B) was used as layer A material, and that the thickness of the layer A was made 0.5 μm to produce a biaxially oriented laminated polyester film having a two-layer (A/B) structure.

EXAMPLE 3

The same procedure as Example 1 was conducted except that polyethylene terephthalate (D) was used as the layer A material, and that the thickness of the layer A was made 0.8 μm to produce a biaxially oriented laminated polyester film having a two-layer (A/B) structure.

EXAMPLE 4

The same procedure as Example 1 was conducted except that polyethylene terephthalate (F) was used as the layer A material, and that the thickness of the layer A was made 0.3 μm to produce a biaxially oriented laminated polyester film having a two-layer (A/B) structure.

EXAMPLE 5

The same procedure as Example 1 was conducted except that a 50/50 (by weight) blend of polyethylene terephthalates (C) and (E) was used as the layer B material to obtain a biaxially oriented laminated polyester film having a two-layer (A/B) structure.

EXAMPLE 6

Using copolymerized polyethylene terephthalate (A) as the layer A material, polyethylene terephthalate (C) as the layer B material and polyethylene terephthalate (E) as layer C material, the film forming operations were carried out according to the procedure of Example 1 except for using of three sets of extruder to obtain a biaxially oriented laminated polyester film having a three-layer (A/B/C) structure. The thickness of the layer A was 0.5 μm and the thickness of the layer C was 0.8 μm, the total thickness of the laminated film being 20 μm.

COMPARATIVE EXAMPLE 1

The same procedure as Example 4 was conducted except that a polyethylene terephthalate containing 0.6% by weight of amorphous silica particles having an average diameter of 3.5 μm and an intrinsic viscosity of 0.630 was used as layer A material, and that the thickness of the layer A was made 1.0 μm to obtain a biaxially oriented laminated polyester film having a two-layer (A/B) structure.

COMPARATIVE EXAMPLE 2

Using a polyethylene terephthalate containing 0.005% by weight of amorphous silica particles having an average diameter of 1.5 μm as starting material, a 20 μm-thick monolayer polyester film was produced. This film was poor in handling property and winding characteristics during film producing process because of unsatisfactory slipperiness.

COMPARATIVE EXAMPLE 3

A similar film was produced in the same manner as Comparative Example 2 except that the content of amorphous silica particles in polyethylene terephthalate was 0.1% by weight. This film was satisfactory in slipperiness but greatly reduced in transparency.

The properties and the results of evaluations of practical performance of the films obtained in the above Examples and Comparative Examples are shown in Tables 1 and 2.

EXAMPLE 7

Each of the biaxially oriented laminated polyester films obtained in Examples 1 to 6, Comparative Example 1 and each of the biaxially oriented polyester films in Comparative Examples 2 to 3 was used as a base film, and a photoresist of the following composition was coated on the side opposite from the layer A of each base film by using a gravure coater and dried to form a 50 μm-thick photoresist layer. Then a protective polyethylene film (thickness: 25 μm thick) was laminated on the said photoresist layer under pressure to obtain a dry resist.

Photoresist Composition

Methyl methacrylate/acrylonitrile/acrylated glycidyl acrylate copolymer (90/5/5 in molar ratio): 95 parts Methyl methacrylate/2-hydroxyethyl acrylate copolymer: 75 parts Triethylene glycol acetate: 25 parts Tert-butylanthraquinone: 15 parts 2,2'-methylene-bis(4-ethyl-6-tert-butyl)phenol: 35 parts Methyl violet: 2.5 parts Methyl ethyl ketone: 800 parts

TABLE 2

| | Surface roughness of layer A (μm) | | Film haze (%) | Practical performance | | |
|---|---|---|---|---|---|---|
| | Ra | Rt | | Resolution | Circuit fault | Handling |
| Example 1 | 0.055 | 0.95 | 0.4 | 1 | 1 | 1 |
| Example 2 | 0.047 | 1.00 | 0.5 | 1 | 2 | 1 |
| Example 3 | 0.020 | 0.36 | 1.3 | 2 | 2 | 1 |
| Example 4 | 0.030 | 0.78 | 0.7 | 1 | 2 | 1 |
| Example 5 | 0.057 | 1.05 | 1.1 | 2 | 1 | 1 |
| Example 6 | 0.053 | 0.90 | 0.9 | 1 | 1 | 1 |
| Comp. Example 1 | 0.045 | 1.70 | 1.8 | 3 | 3 | 1 |

TABLE 1

| | Particles in layer A | | | | Layer structure and thickness (μm) |
|---|---|---|---|---|---|
| | Type of particle | Average diameter (μm) | Particle size distribution (−) | Content (wt %) | |
| Example 1 | Spherical crosslinked polymer particles | 1.0 | 1.05 | 1.0 | A/B (0.6/21.4) |
| Example 2 | Spherical silica particles | 1.2 | 1.1 | 2.0 | A/B (0.5/21.5) |
| Example 3 | Synthetic calcium carbonate | 0.65 | 1.5 | 0.6 | A/B (0.8/21.2) |
| Example 4 | Spherical crosslinked polymer particles | 1.0 | 1.05 | 1.0 | A/B (0.3/21.7) |
| Example 5 | Spherical crosslinked polymer particles | 1.0 | 1.05 | 1.0 | A/B (0.6/21.4) |
| Example 6 | Spherical crosslinked polymer particles | 1.0 | 1.05 | 1.0 | A/B/C (0.5/18.7/0.8) |
| Comp. Example 1 | Amorphous silica particles | 3.5 | 2.8 | 0.6 | A/B (1.0/21.0) |
| Comp. Example 2 | Amorphous silica particles | 1.5 | 2.5 | 0.005 | Monolayer film |
| Comp. Example 3 | Amorphous silica particles | 1.5 | 2.5 | 0.1 | Monolayer film |

TABLE 2-continued

| | Surface roughness of layer A (μm) | | Film haze (%) | Practical performance | | |
|---|---|---|---|---|---|---|
| | Ra | Rt | | Resolution | Circuit fault | Handling |
| Comp. Example 2 | 0.004 | 0.12 | 0.4 | 1 | 3 | 3 |
| Comp. Example 3 | 0.030 | 0.50 | 3.5 | 3 | 2 | 1 |

The laminated films obtained in Examples 1 to 6 satisfied the specific requirements of the biaxially oriented laminated polyester film used in the present invention, and the dry resists obtained in Example 7 by using the said laminated films were high-quality dry resists which showed excellent practical performance.

On the other hand, the laminated film of Comparative Example 1 had too high surface roughness due to large size of the contained particles, and the dry resist was unsatisfactory in resolution and caused image fault.

The monolayer films of Comparative Examples 2 and 3 had the problem that handling property are excessively deteriorated when the particle content is decreased for bettering transparency, and are reduced in transparency when it is tried to satisfy handling property. Thus, with the films of Comparative Examples 2 and 3, it was impossible to obtain a high-quality dry resist.

What is claimed is:

1. A dry resist comprising:
   a biaxially oriented laminated polyester film having a first surface and a second surface opposite said first surface, said first surface provided by a first surface layer containing particles having an average particle diameter of 0.01 to 3.0 μm, said first surface layer having a center line average roughness of 0.005 μm to 0.1 μm and wherein any protuberances on said first surface layer have a maximum height of less than 1.5 μm, and said film has a haze of not more than 1.5%;
   a photoresist layer formed on said second surface of said biaxially oriented laminated polyester film; and
   a protective film formed on said photoresist layer.

2. A dry resist according to claim 1, wherein said first surface layer contains crosslinked polymer particles having an average diameter of 0.1 to 2.0 μm or silica particles having an average diameter of 0.1 to 3.0 μm.

3. A dry resist according to claim 1, wherein the particle size distribution index ($d_{25}/d_{75}$) of the particles contained in said surface layer is not more than 2.0.

4. A dry resist according to claim 1, wherein said first surface layer further comprises a polyester and the content of said particles in said first surface layer is 0.1 to 20.0% by weight based on the weight of the polyester of the first surface layer.

5. A dry resist according to claim 1, wherein the thickness of biaxially oriented laminated polyester film is 10 to 50 μm, the thickness of photoresist layer is 10 to 100 μm and the thickness of protective film is 5 to 100 μm.

6. A dry resist according to claim 1, wherein a coating layer is provided at least between biaxially oriented laminated polyester film and photoresist layer for adjusting adhesion therebetween.

7. A dry resist according to claim 1, wherein said polyester of said biaxially oriented polyester film comprises a resin obtained from an aromatic dicarboxylic acid or an ester thereof and a glycol.

8. A dry resist according to claim 7, wherein not less than 80% of any recurring structural units of said resin comprise ethylene terephthalate or ethylene-2,6-naphthalate units.

9. A dry resist according to claim 1, wherein said particles are selected from the group consisting of calcium carbonate, calcium phosphate, silica, kaolin, talc, titanium dioxide, alumina, barium sulfate, calcium fluoride, lithium fluoride, zeolite, molybdenum sulfide, crosslinked polymer particles, organic particles, precipitated particles, and mixtures thereof.

10. A dry resist according to claim 1, wherein said particles comprise crosslinked polymer particles or silica particles.

11. A dry resist according to claim 1, wherein said photoresist layer is capable of direct crosslinking under influence of activating light, either with or without the presence of a sensitizer or capable of forming crosslinkage through a separate photosensitizer.

12. A dry resist according to claim 1, wherein said photoresist is selected from the group consisting of cinnamic esters of high-molecular weight polyols, chalcone, polyvinyl cinnamate, polyvinyl anisylacetophenone, polyacrylic or polymethacrylic acid amides, polymeric polyols, mixtures of natural colloids with photosensitive crosslinking agents, mixtures of polyvinyl alcohol with borax and ammonium dichromate, mixtures of polyvinyl pyrrolidone with ammonium dichromate and monoammonium phosphate, mixtures of styrene butadiene copolymer with 2,6-di-(4'-azidobenzal)-4-methylcyclohexane and di-n-butylphthalate, mixtures of vinyl acetate-vinyl-3-azidophthalate polymer with 1-methyl-2-benzoylmethylene-β-naphthothiazoline and triethylene glycol diacetate, mixtures of polyamide resins, polyvinyl alcohol and cinnamic esters of cellulose with quinone compounds.

13. A dry resist according to claim 1, wherein said polyester film is at least two-layered.

* * * * *